United States Patent [19]

(12) United States Patent
Van Zanten

(10) Patent No.: US 7,642,855 B2
(45) Date of Patent: Jan. 5, 2010

(54) COMPENSATION OF AN AMPLIFIER COMPRISING AT LEAST TWO GAIN STAGES

(75) Inventor: François Van Zanten, Meylan (FR)

(73) Assignee: STMicroelectronics N.V., Schipol Airport, Amsterdam ( * ) Notice: Subject to any disclaimer, the term of this patent is extended or adjusted under 35 U.S.C. 154(b) by 45 days.

(21) Appl. No.: 11/890,628

(22) Filed: Aug. 6, 2007

(65) Prior Publication Data

US 2008/0030275 A1   Feb. 7, 2008

(30) Foreign Application Priority Data

Aug. 4, 2006   (FR) .................................. 06/53299

(51) Int. Cl.
*H03F 1/14* (2006.01)
(52) U.S. Cl. ................... 330/292; 330/124 R
(58) Field of Classification Search ............... 330/292, 330/124 R, 295, 84, 126
See application file for complete search history.

(56) References Cited

U.S. PATENT DOCUMENTS

| 4,066,919 | A | * | 1/1978 | Huntington | .................. 327/94 |
| 4,578,648 | A | * | 3/1986 | Werrbach | .................. 330/281 |
| 5,121,075 | A | * | 6/1992 | Roach | .................. 330/126 |
| 5,917,376 | A | | 6/1999 | Ivanov | |
| 7,042,291 | B2 | * | 5/2006 | Ueno et al. | .................. 330/258 |

FOREIGN PATENT DOCUMENTS

| EP | 1885057 | 2/2008 |
| FR | 2 854 008 A1 | 10/2004 |

OTHER PUBLICATIONS

Matsuura T et al., "A 1.2-V Feedforward Amplifier and A/D Converter for Mixed Analog/Digital LSLS", IEICE Transactions on Electronics, Electronics Society, Tokyo, JP, vol. E79-C, No. 12, Dec. 1996, pp. 1666-1677, XP000692116.
Bharath Kumar Thandri et al., "A Robust Feedforward Compensation Scheme for Multistage Operational Transconductance Amplifiers with no Miller Capacitors", IEEE Journal of Solid-State Circuits, IEEE Service Center, Piscataway, NJ, US, vol. 38, No. 2, Feb. 2003, XP011065959.
French Search Report for FR 0653299 dated Feb. 23, 2007.
European Search Report for EP07113684, European patent Office, Aug. 21, 2007.
Search Report for FR0653299, Institut National De La Propriete Industrielle (INPI), Feb. 23, 2007.

* cited by examiner

*Primary Examiner*—Henry K Choe
(74) *Attorney, Agent, or Firm*—Kevin D. Jablonski; Graybeal Jackson LLP

(57) ABSTRACT

An embodiment of an amplifier circuit comprising a succession of amplification stages having at least a first amplification stage receiving a first signal and a second amplification stage downstream of the first amplification stage; a stage of unity gain capable of receiving the first signal and of providing a second signal corresponding to the low-impedance copy of the first signal; and a third amplification stage having its input connected to the output of the stage of unity gain by a capacitor and having its output connected to the output of the second amplification stage.

19 Claims, 5 Drawing Sheets

COMPENSATION OF AN AMPLIFIER COMPRISING AT LEAST TWO GAIN STAGES

PRIORITY CLAIM

This application claims priority from French patent application No. 06/53299, filed Aug. 4, 2006, which is incorporated herein by reference.

TECHNICAL FIELD

An embodiment of the present invention relates to the field of amplifiers, and more specifically of amplifiers comprising at least two gain stages.

BACKGROUND

An amplifier comprising at least two gain stages is generally formed of an amplifier with an input transconductance followed by one or several transconductance amplifiers. An amplifier comprising at least two gain stages may have the advantage, over a single-stage amplifier, of being able to operate under low voltage while enabling an output dynamic range that can almost reach the supply voltage. A second advantage may be the possibility to obtain a high open-loop gain.

FIG. 1 schematically shows an example of an amplifier 10 with two gain stages comprising an input terminal IN and an output terminal OUT. Amplifier 10 comprises a transconductance amplifier TE having a "+" input connected to input terminal IN and a "+" output terminal connected to a node F. A "+" input terminal of a transconductance inverter amplifier TS is connected to node F. The "−" output of amplifier TS is connected to output terminal OUT. Call $V_{IN}$, $V_F$, and $V_{OUT}$ the voltages respectively at terminal IN, at node F, and at terminal OUT. To ensure the loop stability, it is necessary to compensate amplifier TS. This is generally done by a so-called Miller compensation, by providing a capacitor $C_M$ between the "+" input and the "−" output of amplifier TS. Capacitor $C_M$ is generally called a Miller capacitor.

FIG. 2 shows a conventional example of an amplifier 20 with three gain stages. As compared with amplifier 10 of FIG. 1, amplifier 20 comprises an intermediary transconductance amplifier TI arranged between amplifiers TE and TS. More specifically, the "+" output of amplifier TE is connected to the "+" input of amplifier TI and the "+" output of amplifier TI is connected to the "+" input of amplifier TS. To ensure the closed loop stability of amplifier 20, an additional Miller capacitor $C_M'$ is provided between the "+" input of amplifier TI and the "−" output of amplifier TS, in addition to the previously-described Miller capacitor $C_M$. Such an arrangement of capacitors $C_M$ and $C_M'$ is generally called a nested Miller structure.

The principle of the Miller compensation may be disclosed by determining in simplified fashion the transfer function of amplifier 10 shown in FIG. 1.

FIG. 3 shows an equivalent electric diagram of amplifier 10 of FIG. 1. It is desired to determine the phase variation of the transfer function of amplifier 10 at the level of the frequency of unity gain, or cut-off frequency, of amplifier 10. Such a cut-off frequency may conventionally be on the order of 1 GHz. For this purpose, a sufficient approximate of the transfer function of amplifier 10 is obtained by considering that transconductance amplifier TE is equivalent to an ideal transconductance amplifier of voltage-current gain g that charges at node F a capacitor of capacitance $C_{L1}$, and that amplifier TS is equivalent to an ideal transconductance amplifier of voltage-current gain $k_1 g$ that charges at terminal OUT a capacitor $C_{L2}$.

In the Laplace plane, the node equation at node F can be written as follows:

$$-gV_{INT}+(pC_{L1}+pC_M)V_F-pC_M V_{OUT}=0 \quad (1)$$

and the node equation at terminal OUT can be written as:

$$(k_1 g-pC_M)V_F-(pC_{L2}+pC_M)V_{OUT}=0 \quad (2)$$

Based on relations (1) and (2), the following transfer function can be obtained:

$$-\frac{V_{OUT}}{V_{IN}} = \frac{1}{p\frac{C_M}{g}} \cdot \frac{1-p\frac{C_M}{k_1 g}}{1+p\frac{C_{L1}C_{L2}+C_{L1}C_M+C_{L2}C_M}{gk_1 C_M}} \quad (3)$$

In the absence of a Miller compensation, that is, for a zero $C_M$, relation (3) becomes:

$$-\frac{V_{OUT}}{V_{IN}} = \frac{1}{p^2 \frac{C_{L1}C_{L2}}{k_1 g^2}} \quad (4)$$

FIG. 4 is a Bode diagram partly showing the asymptotic behavior of gains G1 and G2 of the transfer function of amplifier 10 respectively without and with a Miller compensation and a Bode diagram showing the behavior of phase $\phi 2$ of the transfer function of amplifier 10 with a Miller compensation.

The simplified transfer function of amplifier 10 in the absence of a Miller compensation comprises a pole of second order at the origin. Pulse $\omega_1$ corresponding to the cut-off frequency of amplifier 10 with no compensation is given by the following relation:

$$\omega_1 = \frac{\sqrt{k_1} \cdot g}{\sqrt{C_{L1}C_{L2}}} \quad (5)$$

The phase, not shown, of amplifier 10 with no Miller compensation, is close to $-180°$ at the cut-off frequency (pulse $\omega_1$) so that the phase margin is close to $0°$.

The simplified transfer function of amplifier 10 with a Miller compensation comprises:

first pole, called the dominant pole, at the origin;

second pole, called non-dominant pole, at pulse $\omega_2$ given by the following relation:

$$\omega_2 = \frac{gk_1 C_M}{C_{L1}C_{L2}+C_{L1}C_M+C_{L2}C_M} \quad (6)$$

capacitance $C_M$ being selected to reject the pole (pulse $\omega_2$) beyond the cut-off frequency (pulse $\omega_4$) of amplifier 10 with a Miller compensation; and zero at pulse $\omega_3$ given by the following relation:

$$\omega_3 = \frac{k_1 g}{C_M} \quad (7)$$

The zero being located on the right-hand half-axis of the Laplace plane, it introduces a phase drop at the same time as a gain increase. This is a conventional disadvantage of the Miller compensation and modifications of the circuit of FIG. 1 are generally implemented to reject the zero far beyond the amplifier cut-off frequency.

The dominant pole determines the cut-off frequency, corresponding to pulse $\omega_4$, of amplifier 10 with a Miller compensation enabling obtaining an appropriate phase margin MP2, for example greater than 60°. Pulse $\omega_4$ is given by the following approximate relation:

$$\omega_4 \approx \frac{g}{C_M} \quad (8)$$

To obtain a sufficient phase margin MP2, it can be shown that the cut-off frequency (pulse $\omega_4$) of amplifier 10 with a Miller compensation is lower than the cut-off frequency (pulse $\omega_1$) of amplifier 10 with no Miller compensation.

A disadvantage of the Miller compensation thus may be that a strong decrease in the cut-off frequency (pulse $\omega_4$) of the amplifier is thus obtained. Further, the occurrence of a non-linearity due to the significant slew rate of the amplifier which results from the presence of the Miller capacitors may be observed.

SUMMARY

An embodiment of the present invention is an amplifier comprising at least two gain stages having its loop stability ensured without the use of Miller capacitors.

According to an embodiment of the present invention, the structure of the amplifier is scarcely modified with respect to a conventional amplifier with at least two stages.

An embodiment of the present invention provides an amplifier circuit comprising a succession of amplification stages with at least a first amplification stage receiving a first signal and a second amplification stage downstream of the first amplification stage; a stage of unity gain capable of receiving the first signal and of providing a second signal corresponding to the low-impedance copy of the first signal; and a third amplification stage having its input connected to the output of the stage of unity gain by a capacitor and having its output connected to the output of the second amplification stage.

According to an embodiment of the present invention, the amplifier circuit further comprises a fourth amplification stage between the first and second amplification stages; and a fifth amplification stage having its input connected to the output of the stage of unity gain by an additional capacitor and having its output connected to the output of the fourth amplification stage.

According to an embodiment of the present invention, the stage of unity gain comprises at least one MOS transistor assembled as a follower source.

According to an embodiment of the present invention, the amplifier circuit comprises first and second differential input terminals. The first amplification stage comprises first and second MOS transistors of a first conductivity type, the gate of the first transistor being connected to the first input terminal and the gate of the second transistor being connected to the second input terminal. The second amplification stage comprises third and fourth MOS transistors of a second conductivity type. The stage of unity gain comprises fifth and sixth MOS transistors of the first conductivity type, the gate of the fifth transistor being connected to the first input terminal and the gate of the sixth transistor being connected to the second input terminal. The third amplification stage comprises seventh and eighth MOS transistors of the first conductivity type, one of the power terminals of the seventh transistor being connected to one of the power terminals of the third transistor and one of the power terminals of the eighth transistor being connected to one of the power terminals of the fourth transistor. The gate of the third transistor is connected to one of the power terminals of the second transistor, the gate of the fourth transistor being connected to one of the power terminals of the first transistor, the gate of the seventh transistor being connected to one of the power terminals of the fifth transistor via a first capacitor and the gate of the eighth transistor being connected to one of the power terminals of the sixth transistor via a second capacitor or the gate of the third transistor is connected to one of the power terminals of the first transistor, the gate of the fourth transistor being connected to one of the power terminals of the second transistor, the gate of the seventh transistor being connected to one of the power terminals of the fifth transistor via a first capacitor and the gate of the eighth transistor being connected to one of the power terminals of the sixth transistor via a second capacitor or the gate of the third transistor is connected to one of the power terminals of the first transistor, the gate of the fourth transistor being connected to one of the power terminals of the second transistor, the gate of the seventh transistor being connected to one of the power terminals of the sixth transistor via a first capacitor and the gate of the eighth transistor being connected to one of the power terminals of the fifth transistor via a second capacitor.

According to an embodiment of the present invention, the gate of the seventh transistor is connected to a terminal of a current source via a first resistor and the gate of the eighth transistor is connected to the terminal of the current source via a second resistor.

According to an embodiment of the present invention, the amplifier circuit further comprises ninth and tenth MOS transistors of the first conductivity type, one of the power terminals of the ninth transistor being connected to one of the power terminals of the fifth transistor and one of the power terminals of the tenth transistor being connected to one of the power terminals of the sixth transistor, the gate of the ninth transistor being connected to one of the power terminals of the sixth transistor via a third capacitor and the gate of the tenth transistor being connected to one of the power terminals of the fifth transistor via a fourth capacitor.

According to an embodiment of the present invention, the gate of the ninth transistor is connected to a terminal of a current source via a third resistor and the gate of the tenth transistor is connected to the terminal of the current source via a fourth resistor.

According to an embodiment of the present invention, the first amplification stage comprises eleventh and twelfth MOS transistors of the first conductivity type, one of the power terminals of the eleventh transistor being connected to one of the power terminals of the first transistor and one of the power terminals of the twelfth transistor being connected to one of the power terminals of the second transistor, the amplifier circuit comprising a circuit for biasing the gates of the eleventh and twelfth transistors.

According to an embodiment of the present invention, the bias circuit comprises thirteenth and fourteenth MOS transistors of the first conductivity type, diode-assembled, the gate of the thirteenth transistor being connected to the gate of the eleventh transistor and the gate of the fourteenth transistor being connected to the gate of the twelfth transistor, one of the power terminals of the thirteenth transistor being connected to one of the power terminals of the fifth transistor and one of the power terminals of the fourteenth transistor being connected to one of the power terminals of the sixth transistor, the power terminals of the thirteenth transistor being interconnected by a fifth capacitor and the power terminals of the fourteenth transistor being interconnected by a sixth capacitor.

According to an embodiment of the present invention, the amplifier circuit comprises a fourth amplification stage between the first and the second amplification stages, the fourth amplification stage comprising fifteenth and sixteenth MOS transistors of the second conductivity type, the gate of the fifteenth MOS transistor being connected to one of the power terminals of the first transistor and the gate of the sixteenth MOS transistor being connected to one of the power terminals of the second transistor, the gate of the third transistor being connected to one of the power terminals of the fifteenth transistor and the gate of the fourth transistor being connected to one of the power terminals of the sixteenth transistor.

An embodiment of the present invention provides an integrated circuit comprising at least one amplifier circuit such as defined hereabove.

An embodiment of the present invention provides an analog-to-digital converter, especially of pipeline type, comprising at least one amplifier circuit such as defined hereabove.

An embodiment of the present invention provides a method for amplifying a first signal comprising the amplification of the first signal through a first amplification path in which the first signal is successively amplified several times, comprising at least a first amplification of the first signal and a second subsequent amplification providing a second signal; and the amplification of the first signal through a second amplification path comprising the provision of a third signal corresponding to the low-impedance copying of the first signal, and the imposing, at frequencies greater than a given frequency, of the phase of the second signal from the third signal.

BRIEF DESCRIPTION OF THE DRAWINGS

Features and advantages of one or more embodiments of the present invention will be discussed in detail in the following non-limiting description of specific embodiments in connection with the accompanying drawings.

DETAILED DESCRIPTION

Figure 1:
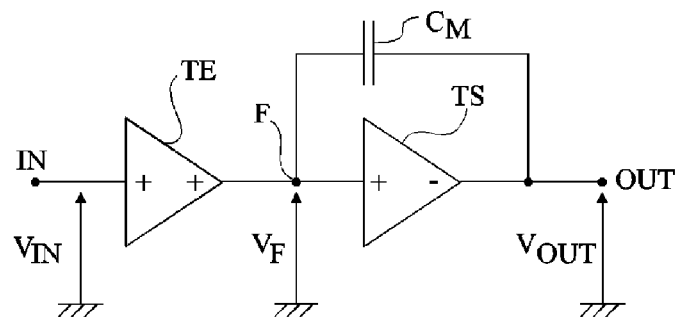
FIGS. 1 and 2, previously described, show conventional examples of amplifiers, respectively with two and three gain stages.

For clarity, same elements have been designated with same reference numerals in the different drawings.

An embodiment of the present invention provides, for an amplifier having at least two amplification stages, copying at low impedance the input signal of the amplifier and using this low-impedance signal to force, at higher frequencies, the phase of certain well-selected intermediary nodes of the amplifier and thus enabling the maintaining of the phase margin necessary for good loop stability.

Figure 5:
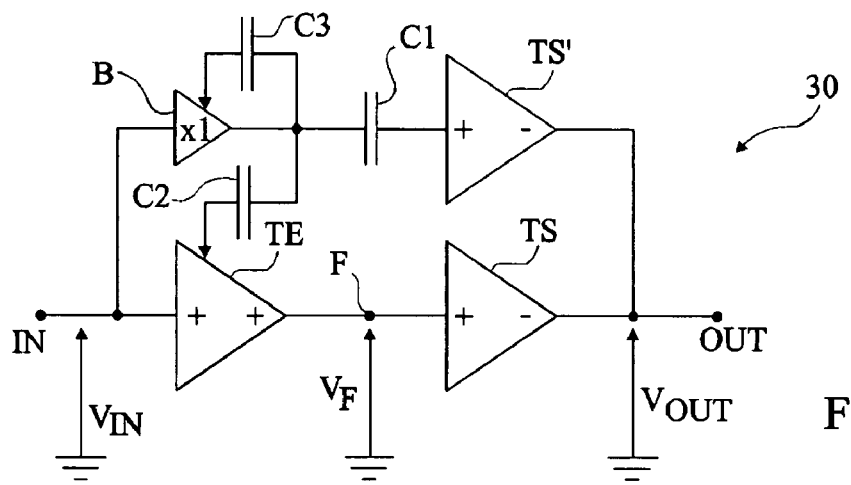
FIG. 5 shows an amplifier with two gain stages according to an embodiment of the present invention.

FIG. 5 shows an amplifier 30 with two gain stages according to an embodiment of the present invention which comprises the elements of amplifier 10 shown in FIG. 1, with the difference that Miller compensation capacitor $C_M$ is absent. Further, amplifier 30 comprises an amplifier x1 of unity gain having its input connected to terminal IN and having its output connected to the "+" input of a transconductance amplifier TS' via a capacitor C1. The "−" output of amplifier TS' is connected to the "−" output of amplifier TS. As will be described in further detail hereafter, it may further be advantageous to redistribute the output of amplifier x1 on itself via a capacitor C3 and on amplifier TE via a capacitor C2.

The operating principle of amplifier 30 is the following. Amplifier x1 with a unity gain copies under low impedance input signal $V_{IN}$ and redistributes it at high frequency via capacitor C1 on the input of amplifier TS', the output of amplifier TS' being connected to output terminal OUT Amplifier TS ensures the usual path of the signal received by amplifier 30 from the input to the output of amplifier 30 while amplifier TS', having its output arranged in parallel with the output of amplifier TS, ensures a direct high-frequency path of the signal received by amplifier 30. Further, as will be described in more detail hereafter, the fact of redistributing the output of amplifier x1 of unity gain on itself and on amplifier TE enables increasing the operating speed and the high-frequency response of amplifiers x1 and TE.

Figure 3:
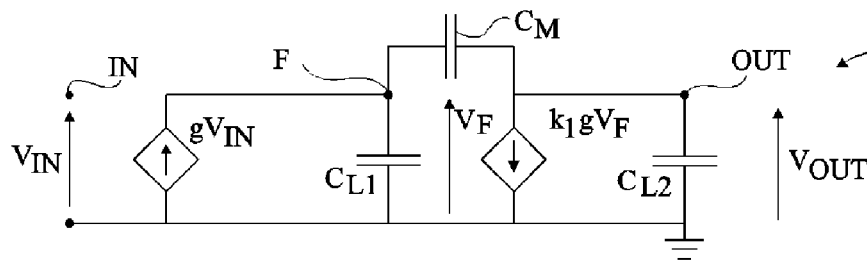
FIG. 3, previously described, shows an electric diagram equivalent to the amplifier of FIG. 1.
Figure 4:
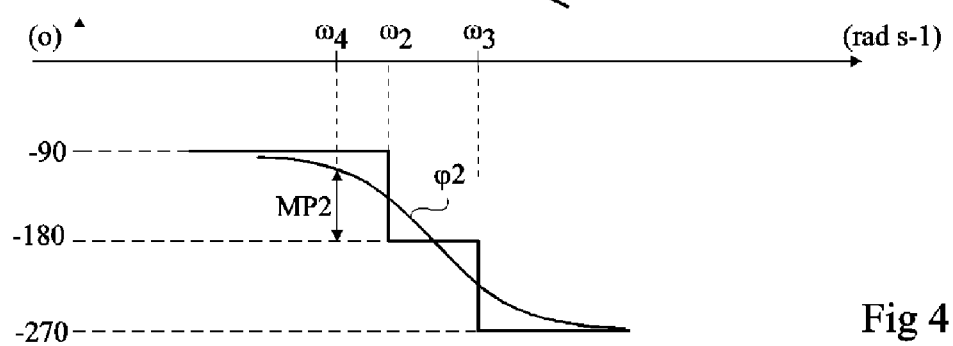
FIG. 4, previously described, shows the variation of the gain and of the phase of the transfer function of the amplifier of FIG. 1 in the presence and in the absence of a Miller compensation.
Figure 6:
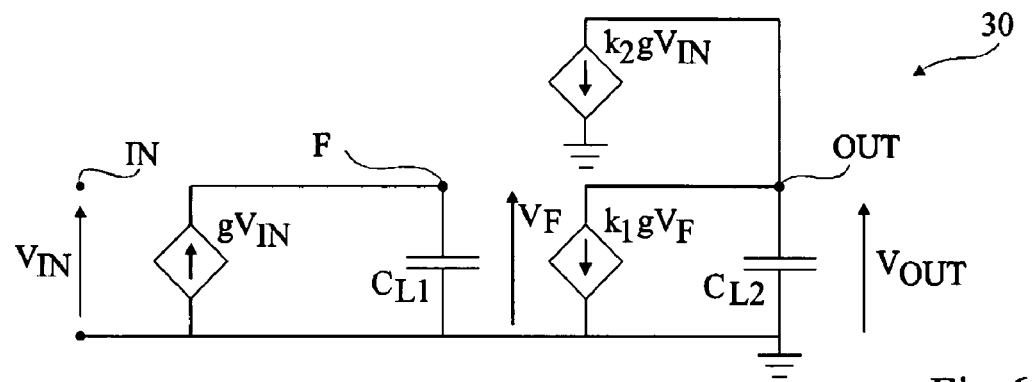
FIG. 6 shows an equivalent electric diagram of the amplifier of FIG. 5.

FIG. 6 shows an equivalent electric diagram of amplifier 30 of FIG. 5, where capacitors C2 and C3 are not present. The electric diagram of FIG. 6 is identical to the diagram shown in FIG. 3 except that Miller capacitor $C_M$ is absent. It is further considered that amplifier TS' is equivalent to an ideal transconductance amplifier of voltage-current gain $k_2g$ that charges a capacitor $C_{L2}$. Since amplifier TS' is assumed to be ideal, that is, with an infinite input impedance, it is possible not to show amplifier x1. Further, at the considered frequencies, capacitor $C_1$ can be considered as equivalent to a closed circuit.

In the Laplace plane, the node equation at node F can be written as follows:

$$-gV_{IN}+pC_{L1}V_F=0 \qquad (9)$$

and the node equation at terminal OUT can be written as:

$$k_1gV_F+pC_{L2}V_{OUT}+k_2gV_{IN}=0 \qquad (10)$$

Based on relations (9) and (10), the following simplified transfer function is obtained:

$$-\frac{V_{OUT}}{V_{IN}} = \frac{1}{p^2} \cdot \frac{k_1 g^2}{C_{L1}C_{L2}} \cdot \left(1 + p\frac{k_2 C_{L1}}{k_1 g}\right) \quad (11)$$

The simplified transfer function of amplifier 30 thus comprises a pole of second order at the origin as for uncompensated amplifier 10. Further, the transfer function of amplifier 30 comprises a zero, introduced by amplifier TS', at pulse $\omega_5$ given by the following relation:

$$\omega_5 = \frac{k_1 g}{k_2 C_{L1}} \quad (12)$$

The zero being located on the left-hand half-axis of the Laplace plane, a positive phase contribution and a gain increase occur.

Figure 7:
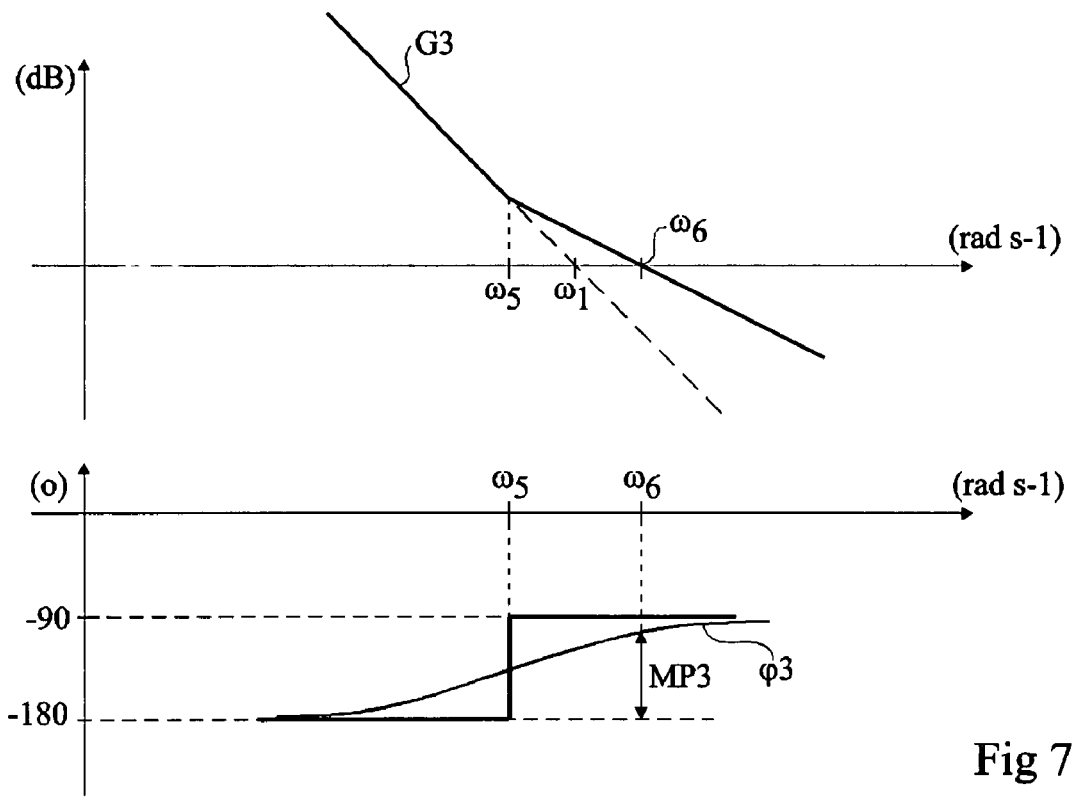
FIG. 7 schematically shows the variation of the gain and of the phase of the transfer function of the amplifier of FIG. 5.

FIG. 7 is a Bode diagram partly representing the asymptotic behavior of gain G3 and the behavior of phase φ3 of the simplified transfer function of amplifier 30. By the selection of amplifiers TE, TS, and TS', it can be ensured that pulse $\omega_5$ is lower than pulse $\omega_1$ corresponding to the cut-off frequency of the uncompensated amplifier. The zero then enables raising the phase of the transfer function before pulse $\omega_1$. A phase margin MP3 at the cut-off frequency of amplifier 30 (corresponding to pulse $\omega_6$) sufficient to ensure the closed-loop stability of amplifier 30 is then obtained. Further, embodiments of the present invention do not decrease the amplifier speed since the cut-off frequency of amplifier 30 (pulse $\omega_6$) is greater than the cut-off frequency of uncompensated amplifier 10 (pulse $\omega_1$).

Figure 2:
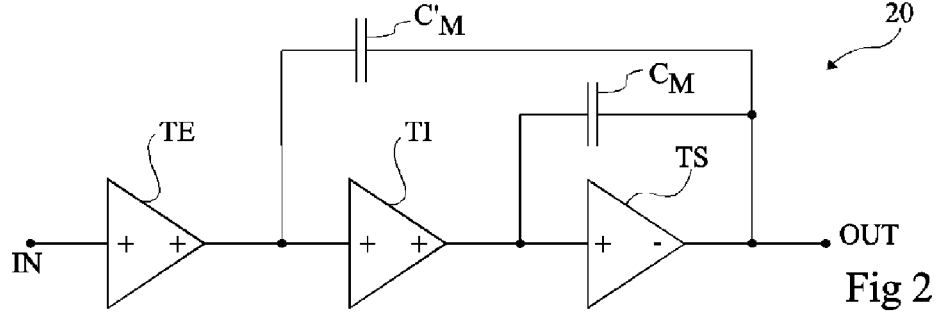
Figure 8:
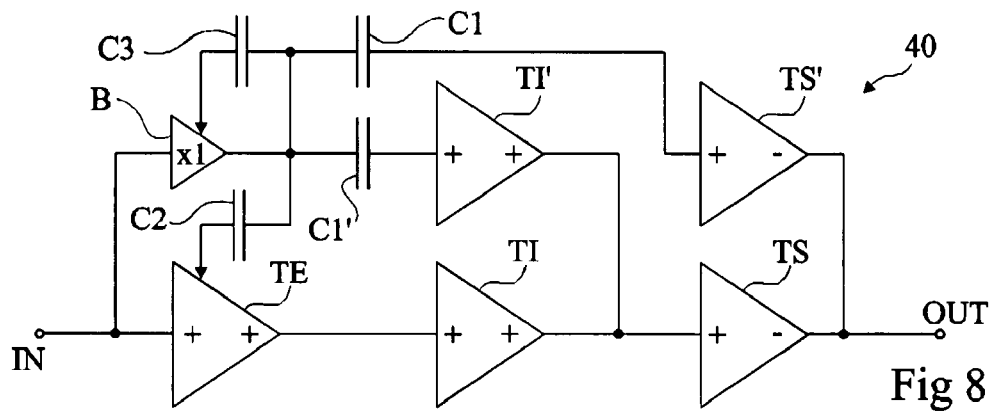
FIG. 8 shows an amplifier with three gain stages according to an embodiment of the present invention.

FIG. 8 shows an amplifier 40 with three gain stages according to an embodiment of the present invention which comprises the elements of amplifier 20 shown in FIG. 2, except that Miller capacitors $C_M$, $C_M'$ are absent. Amplifier 40 comprises the same compensation elements as amplifier 30 shown in FIG. 3, that is, amplifier x1 of unity gain having its input connected to terminal IN and having its output connected to the input of amplifier TS' via capacitor C1, the output of amplifier TS' being connected to output terminal OUT Amplifier 40 further comprises a transconductance amplifier TI' having its "+" input connected to the output of amplifier B of unity gain via a capacitor C1' and having its "+" input connected to output "+" of amplifier TI.

Figure 9:
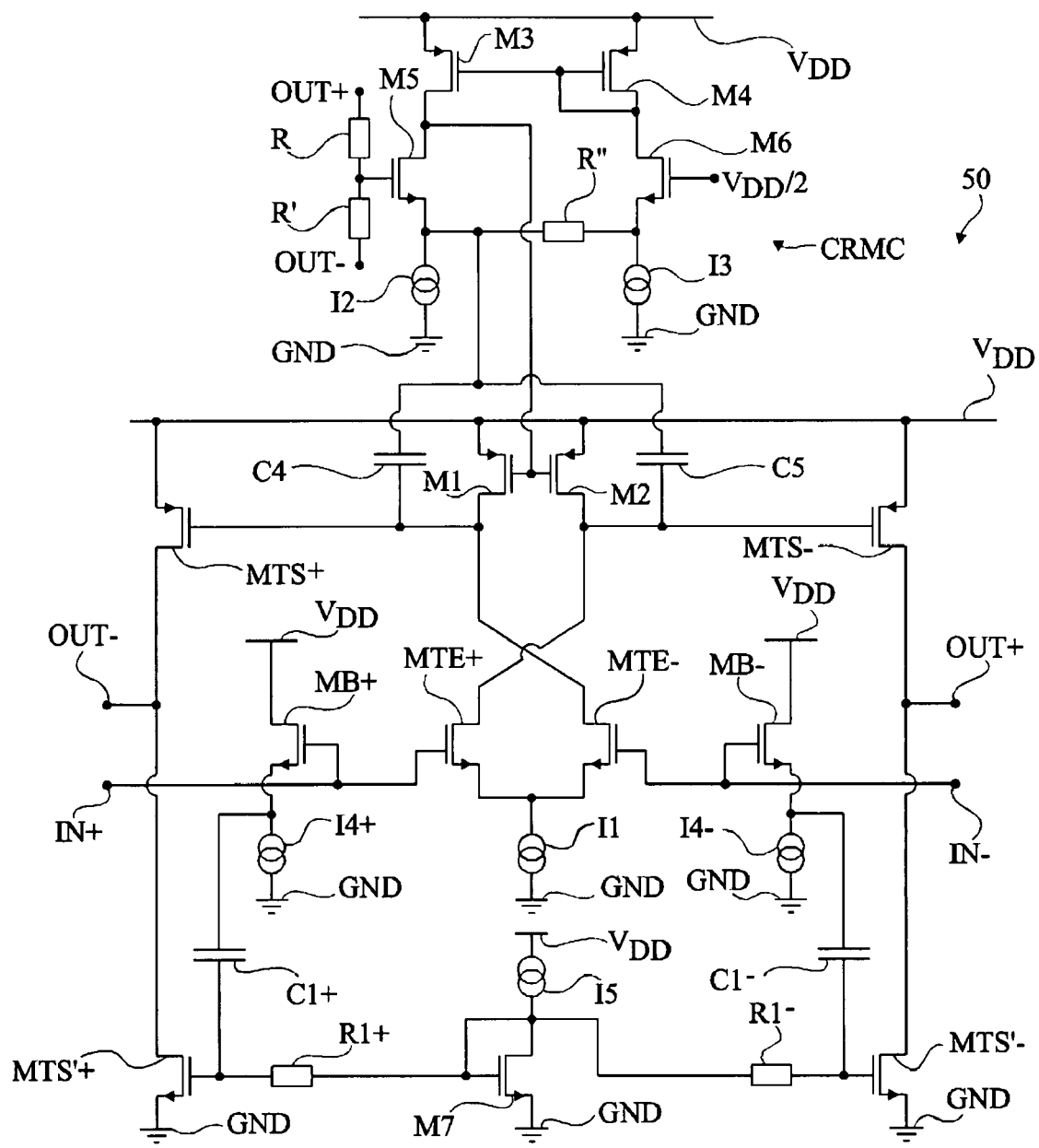
FIG. 9 shows a more detailed embodiment of an amplifier with differential inputs and outputs which is based on the structure of the amplifier of FIG. 5.

FIG. 9 shows an embodiment of an amplifier 50 with two differential inputs IN+ and IN- and with two differential outputs OUT+ and OUT- which is based on the structure of amplifier 30 shown in FIG. 5, in its simplified version without capacitors C2 and C3. As compared with amplifier 30, amplifier 50 comprises two amplification lines so that for amplifier 50, all amplifiers TE, TS, and TS' have two inputs and two outputs. Further, elements B (corresponds to the amplifier x1 in FIG. 5) and C1 are doubled for amplifier 50 and suffix "+" is associated with the components associated with the path connecting input IN+ to output OUT- and suffix "-" is associated with the components associated with the path connecting input IN- to output OUT+. Unless otherwise mentioned, components designated with a same reference numeral respectively followed by suffix "+" and "-" are identical.

Amplifier TE is formed of an N-channel MOS transistor MTE+ having its gate connected to input terminal IN+ and of an N-channel MOS transistor MTE- having its gate connected to input terminal IN-. The sources of transistors MTE+ and MTE- are connected to a terminal of a constant current source I1 having its other terminal connected to a source of a low reference voltage, for example, ground GND.

Amplifier TS comprises a P-channel MOS transistor MTS+ having its gate connected to the drain of transistor MTE- and a P-channel MOS transistor MTS- having its gate connected to the drain of transistor MTE+. The sources of transistors MTS+ and MTS- are connected to a high reference voltage source, for example, power supply $V_{DD}$ of the circuit. The drain of transistor MTS+ is connected to output terminal OUT- and the drain of transistor MTS- is connected to output terminal OUT+.

Amplifier 50 conventionally comprises a common-mode feedback circuit CRMC which may have any known structure. As an example, shown is a common-mode feedback circuit CRMC having the structure described in French patent 2854008 incorporated by reference and filed by the applicant. Circuit CRMC comprises P-channel MOS transistors M1 and M2 having their gates connected together and having their sources connected to $V_{DD}$. The drain of transistor M1 is connected to the gate of transistor MTS+ and the drain of transistor M2 is connected to the gate of transistor MTS-. Circuit CRMC comprises a current mirror formed of two P-channel MOS transistors M3 and M4 having their gates connected together and their sources connected to $V_{DD}$. The drain of transistor M3 is connected to the gates of transistors M1 and M2 and to the drain of an N-channel MOS transistor M5. The source of transistor M5 is connected to a terminal of a constant current source I2 having its other terminal connected to ground GND. The gate and the drain of transistor M4 are connected to the drain of an N-channel MOS transistor M6. The source of transistor M6 is connected to a terminal of a constant current source I3 having its other terminal connected to ground GND. The gate of transistor M5 is connected to terminal OUT+ via a resistor R and to terminal OUT- via a resistor R'. The gate of transistor M6 receives a voltage equal to half voltage $V_{DD}$. The source of transistor M5 is connected to the source of transistor M6 via a resistor R", to the gate of transistor MTS+ via a capacitor C4 and to the gate of transistor MTS- via a capacitor C5.

Amplifier B+ (corresponds to amplifier x1 in FIG. 5) is formed of an N-channel MOS transistor MB+ assembled as a follower source. The drain of transistor MB+ is connected to power supply $V_{DD}$. The source of transistor MB+ is connected to a terminal of a constant current source I4+ having its other terminal connected to ground GND. The gate of transistor MB+ is connected to input terminal IN+. Similarly, amplifier B- (corresponds to amplifier x1 in FIG. 5) is formed of an N-channel MOS transistor MB- assembled as a follower source. The drain of transistor MB- is connected to power supply $V_{DD}$. The source of transistor MB- is connected to a terminal of a constant current source I4- having its other terminal connected to ground GND. The gate of transistor MB- is connected to input terminal IN-.

Amplifier TS' is formed of an N-channel MOS transistor MTS'+ having its drain connected to output terminal OUT- and having its source connected to ground GND and of an N-channel MOS transistor MTS'- having its drain connected to output terminal OUT+ and having its source connected to ground GND. The gate of transistor MTS'+ is connected to the gate of an N-channel MOS transistor M7 via a resistor R1+. The gate of transistor MTS'- is connected to the gate of transistor M7 via a resistor R1-. The drain and the gate of transistor M7 are connected to a terminal of a current source I5 having its other terminal connected to $V_{DD}$. The source of transistor M7 is connected to ground GND. The gate of transistor MTS'+ is connected to the source of transistor MB+ via capacitor C1+ and the gate of transistor MTS'− is connected to the source of transistor MB− via capacitor C1−.

The operation of amplifier 50 will now be described. Transistors MB+ and MB− being assembled as a source follower, they reproduce at low impedance on their source the signal on the corresponding input terminal IN+ and IN−. At low frequencies, capacitors C1+ and C1− are substantially equivalent to open circuits. Transistors MTS'− and MTS'+ of amplifier TS' play the role of bias current sources of transistors MTS− and MTS+ of amplifier TS, the D.C. biasing of the gates of transistors MTS'+ and MTS'− being performed via resistors R1− and R1+. Amplifier 50 then operates as a conventional amplifier with two gain stages. At high frequencies, capacitors C1+ and C1− are substantially equivalent to closed circuits so that the voltages at the sources of transistors MB+ and MB− are respectively applied to the gates of transistors MTS'+ and MTS'−. This enables forcing the phase of the signals at output terminals OUT+ and OUT−. Schematically, it can be considered, at high frequencies, that transistors MTS+ and MTS− play the role of constant current sources for biasing transistors MTS'+ and MTS'−. Indeed, the signals applied to the gates of transistors MTS+ and MTS− follow the usual amplification path and are thus very attenuated at high frequencies. Time constant R1+C1+ (respectively R1−C1−) determines the frequency from which the phase compensation is active.

Figure 10:
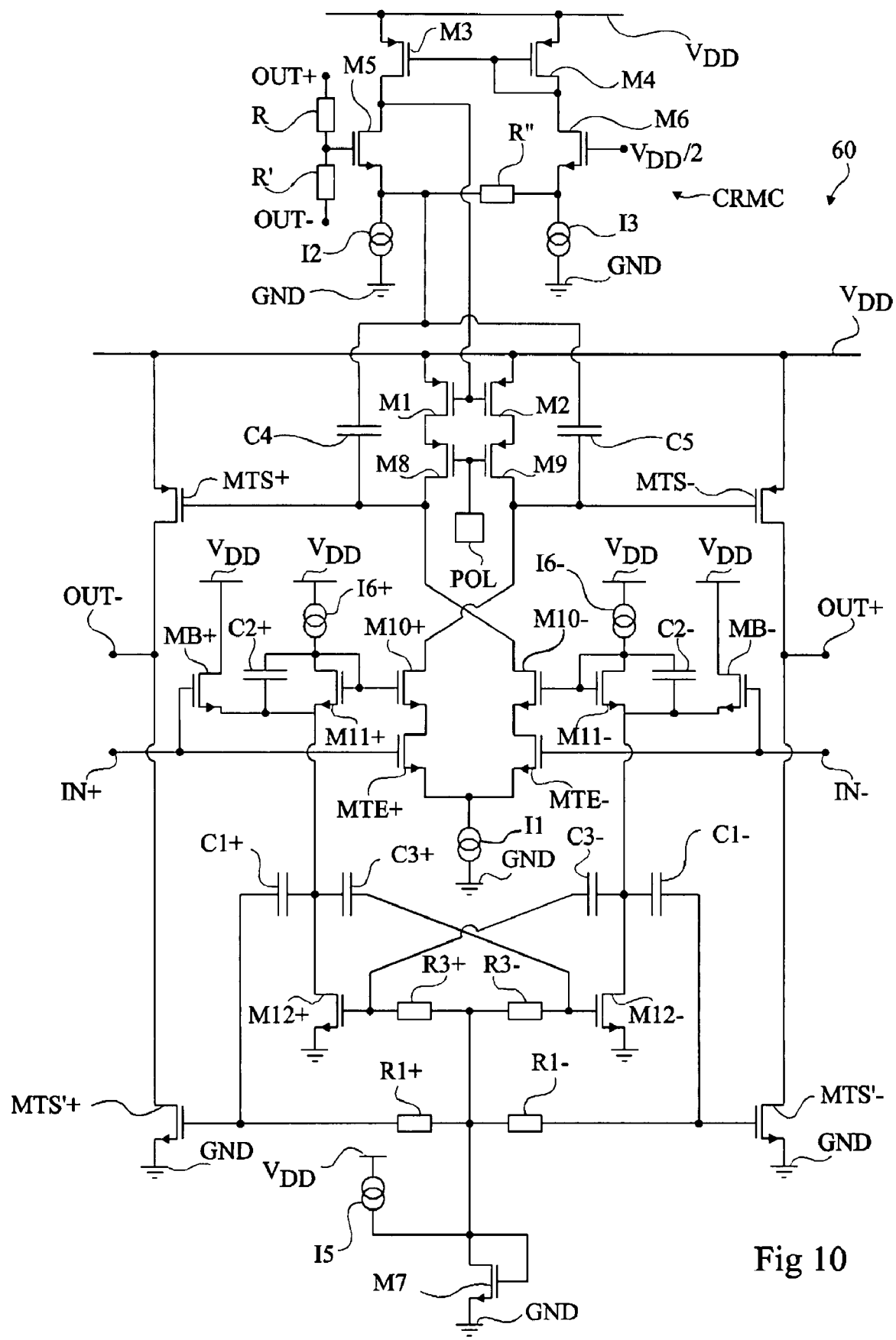
FIG. 10 shows a variation of the amplifier of FIG. 9.

FIG. 10 shows an amplifier 60 which corresponds to a variation of amplifier 50.

As compared with amplifier 50, a cascode-type assembly of transistors M1 and M2 is provided. For this purpose, amplifier 60 comprises P-channel MOS transistors M8 and M9 having their gates connected to a source of a bias voltage POL. The drain of transistor M8 is connected to the gate of transistor MTS+ and the source of transistor M8 is connected to the drain of transistor M1. The drain of transistor M9 is connected to the gate of transistor MTS− and the source of transistor M9 is connected to the drain of transistor M2.

Similarly, a cascode-type assembly of transistors MTE+ and MTE− is provided. For this purpose, an N-channel MOS transistor M10+ having its source connected to the drain of transistor MTE+ and having its drain connected to the drain of transistor M9 is provided. Further, an N-channel MOS transistor M10− having its source connected to the drain of transistor MTE− and having its drain connected to the drain of transistor M8 is provided.

The power supply of the gates of transistors M10+ and M10− is formed by a neutralization circuit. For this purpose, the gate of transistor M10+ is connected to the gate of a diode-assembled N-channel MOS transistor M1+. The drain and the gate of transistor M11+ are connected to a terminal of a constant current source I6+ having its other terminal connected to $V_{DD}$. The source of transistor M11+ is connected to the source of transistor MB+. The drain of transistor M11+ is connected to the source of transistor MB+ via capacitor C2+. The source of transistor M11+ is connected to the drain of an N-channel MOS transistor M12+ having its source connected to ground GND. The gate of transistor M12+ is connected to the drain of transistor M7 via a resistor R3+. Similarly, the gate of transistor M10− is connected to the gate of a diode-assembled N-channel MOS transistor M11−. The gate and the drain of transistor M11− are connected to a terminal of a constant current source I6− having its other terminal connected to $V_{DD}$. The source of transistor M11− is connected to the source of transistor MB−. The drain of transistor M11− is connected to the source of transistor MB− via capacitor C2−. The source of transistor M11− is connected to the drain of an N-channel MOS transistor M12− having its source connected to ground GND. The gate of transistor M12− is connected to the drain of transistor M7 via a resistor R3−. Transistors M12+ and M12−respectively form the bias current sources of transistors MB+ and MB−. The D.C. biasing of transistors M12+ and M12− is respectively ensured by resistors R3+ and R3−.

Further, to improve the performances of amplifiers B+ and B−, capacitor C3+ connects the source of transistor MB+ to the gate of transistor M12− and capacitor C3− connects the source of transistor MB− to the gate of transistor M12+.

The copying of the signal on input terminal IN+ (respectively IN−) at low impedance enables biasing transistor M10+ (respectively M10−). Transistor M11+ (respectively M11−), diode-assembled, enables raising the voltage applied to the gate of transistor M10+ (respectively M10−) of a gate-source voltage. The neutralization circuit which ensures the power supply of the gates of transistors M10+ and M11− enables increasing the gain and the passband of amplifier TE and canceling its input capacitance. Transistors M11+ and M11− are respectively short-circuited by capacitors C2+ and C2− to maintain on the gates of cascode-assembled transistors M10+ and M10−the input signal under low impedance at high frequency.

The fact of connecting the sources of transistors MB+ and MB− respectively to the gates of transistors M12− and M12+ via capacitors C3+ and C3− respectively enables improving the speed of transistors MB+ and MB−. Indeed, at low frequencies, capacitors C3+ and C3− are equivalent to open circuits and transistors M12+ and M12− are controlled by a constant gate voltage. At high frequencies, capacitors C3+ and C3− are equivalent to closed circuits and the signals at the sources of transistors MB+ and MB− are respectively applied to the gates of transistors M12− and M12+. Time constant R3+C3+ (respectively R3−C3−) determines the transition from low frequencies to high frequencies.

The copying of the low-impedance input signal is thus used to control transistors M12+ and M12− at high frequencies. Such a reactive arrangement (but of gain close to 1 if the geometries of transistors MB+ and M12− and MB− and M12+ are equal, thus ensuring the stability) considerably improves the speed of transistors MB+ and MB− by transforming the circuit into push-pull for high frequencies. This can be illustrated by an example. When a falling edge is applied to input terminal IN+, it is desired that the voltage at the source of transistor MB+ decreases as fast as possible to follow the voltage at input terminal IN+. The application of a falling edge on input terminal IN+ corresponds to the application of a rising edge on input terminal IN−. This results, via capacitor C3−, in an increase in the voltage at the gate of common-source assembled transistor M12+. This results in an increase in the gate-source voltage of transistor M12+, thus easing the decrease in the voltage at the source of transistor MB+.

Figure 11:
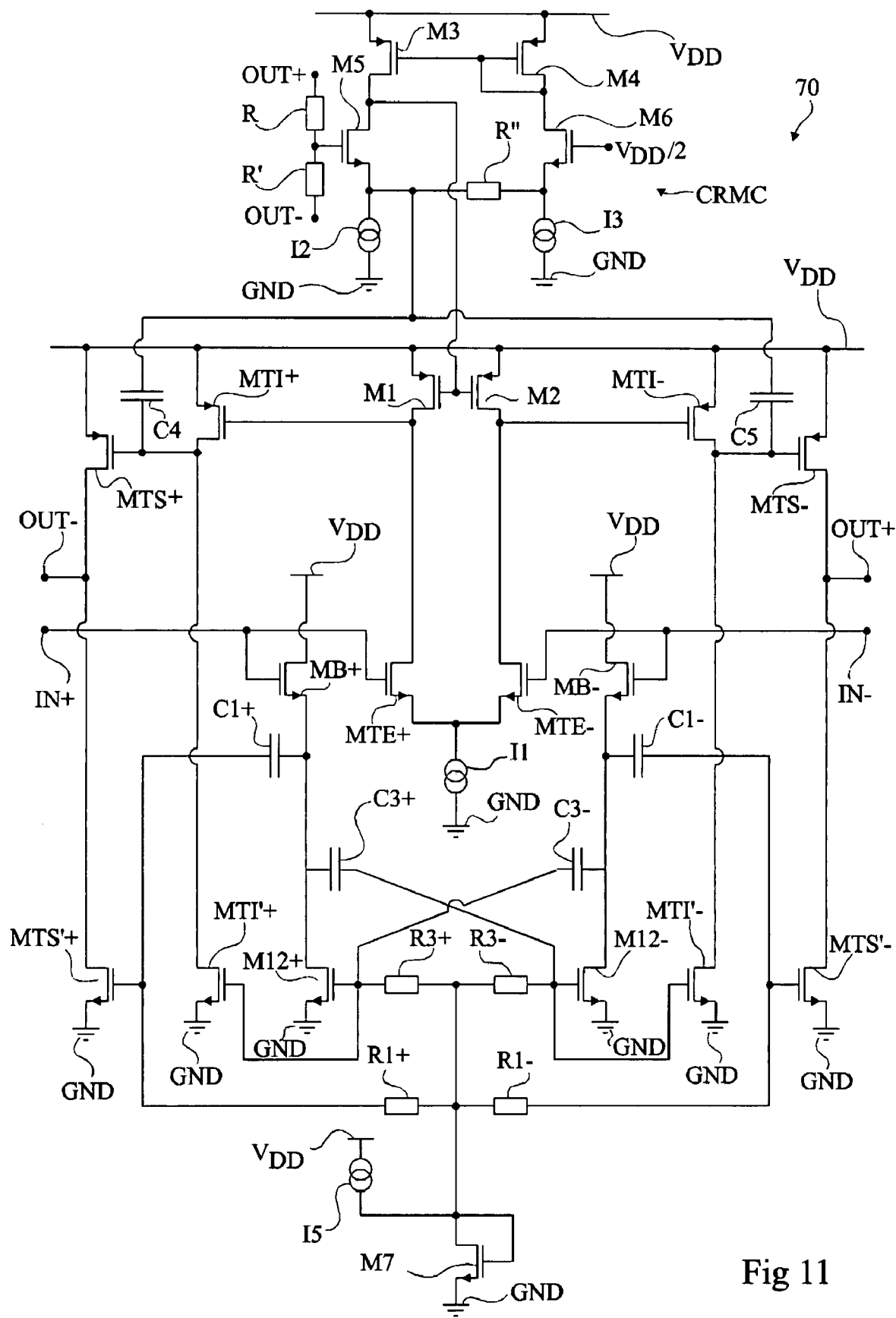
FIG. 11 shows a more detailed embodiment with differential inputs and outputs which is based on the structure of the amplifier of FIG. 8.

FIG. 11 shows an amplifier 70 with two differential inputs IN+ and IN− and with two differential outputs OUT+ and OUT− which is based on the structure of amplifier 40 shown in FIG. 8, capacitor C2 being absent. Suffixes "+" and "−" are used similarly to what has been described previously for amplifier 50. Amplifiers TE, TS, TS' have a structure identical to that respectively of amplifiers TE, TS, TS' of amplifier 50. Circuit CRMC has a structure similar to that of circuit CRMC of amplifier 50.

Amplifier TI is formed of two P-channel MOS transistors MTI+ and MTI−. The source of transistor MTI+ is connected to power supply $V_{DD}$, the gate of transistor MTI+ is connected to the drain of transistor MTE+ and the drain of transistor MTI+ is connected to the gate of transistor MTS+. The source of transistor MTI– is connected to power supply $V_{DD}$, the gate of transistor MTI– is connected to the drain of transistor MTE– and the drain of transistor MTI– is connected to the gate of transistor MTS–.

Amplifier TI' is formed of two N-channel MOS transistors MTI'+ and MTI'–. The source of transistor MTI'+ is connected to ground GND, the drain of transistor MTI'+ is connected to the drain of transistor MTI+, and the gate of transistor MTI'+ is connected to the gate of transistor M12+. The source of transistor MTI'– is connected to ground GND, the drain of transistor MTI– is connected to the drain of transistor MTI– and the gate of transistor MTI'– is connected to the gate of transistor M12–.

The operation of amplifier 70 will now be described. Transistors MB+, MB– control at high frequencies both amplifier TS', as described hereabove in relation with amplifier 50, and amplifier TI', the role played by capacitors C1'+ and C1'– being fulfilled, in the present exemplary embodiment, by capacitors C3+ and C3–.

Transistors MB+ and MB– being assembled as a follower source, they reproduce at low impedance on their source the signal on the corresponding input terminal IN+ and IN–. At low frequencies, capacitors C3+ and C3– are substantially equivalent to open circuits. Transistors MTI'+ and MTI'– of amplifier TI' then play the role of constant current bias sources respectively of transistors MTI+ and MTI– of amplifier TI, the D.C. biasing of transistors MTI'+ and MTI'– being respectively performed via resistors R3+ and R3–. Amplifier 70 then operates as a conventional amplifier with three gain stages. At high frequencies, capacitors C3+ and C3– are substantially equivalent to closed circuits so that the voltages at the sources of transistors MB+ and MB– are respectively applied to the gates of transistors MTI'– and MTI'+. This enables forcing the phase of the signals at the drains of transistors MTI'+ and MTI–. Time constant R3+C3+ (respectively R3–C3–) determines the frequency from which the phase compensation is active.

Amplifier 70 enables further obtaining strong output currents since the gates of transistors MTS+ and MTS– can go down to a voltage close to ground.

Of course, amplifier 70 may comprise a cascode assembly of transistors MTE+ and MTE– similarly to what has been previously described for amplifier 60 in relation with FIG. 10. Further, a neutralization circuit may be provided for the supply of the cascode transistor gates as for amplifier 60.

Amplifiers according to embodiments of the present invention may be used in any electronic circuit in which it is necessary to perform a fast amplification operation with a great linearity. These are, for example, amplifiers for analog-to-digital converters, especially converters of pipeline type, filters which require a great linearity, especially PMAs (Post Mixer Amplifiers) used in mobile telephony, etc. And these circuits may be used in systems, such as a cell phone.

Embodiments of the present invention have been described in relation with amplifiers comprising two and three amplification stages but it will easily adapt to an amplifier comprising more than three amplification stages.

Embodiments of the present invention have been described in relation with MOS transistors of a given conductivity type but they will easily adapt to MOS transistors of the complementary conductivity type, by performing a permutation of the N-type MOS transistors with P-type MOS transistors and conversely. Further, embodiments of the present invention will easily adapt to bipolar transistors or to a combination of MOS and bipolar transistors.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. An amplifier circuit comprising:
   a succession of amplification stages having at least a first amplification stage receiving a first signal and a second amplification stage downstream of the first amplification stage, the first amplification stage being electrically coupled to the second amplification stage via a component other than a capacitor;
   a stage of unity gain capable of receiving the first signal and of providing a second signal corresponding to the low-impedance copy of the first signal; and
   a third amplification stage having its input connected to the output of the stage of unity gain by a capacitor and having its output connected to the output of the second amplification stage.

2. The amplifier circuit of claim 1, further comprising: a fourth amplification stage between the first and second amplification stages; and a fifth amplification stage having its input connected to the output of the stage of unity gain by an additional capacitor and having its output connected to the output of the fourth amplification stage.

3. The amplifier circuit of claim 1, wherein the stage of unity gain comprises at least one MOS transistor assembled as a follower source.

4. The amplifier circuit of claim 1, comprising first and second differential input terminals, wherein the first amplification stage comprises first and second MOS transistors of a first conductivity type, the gate of the first transistor being connected to the first input terminal and the gate of the second transistor being connected to the second input terminals, wherein the second amplification stage comprises third and fourth MOS transistors of a second conductivity type, wherein the stage of unity gain comprises fifth and sixth MOS transistors of the first conductivity type, the gate of the fifth transistor being connected to the first input terminal and the gate of the sixth transistor being connected to the second input terminal, wherein the third amplification stage comprises seventh and eighth MOS transistors of the first conductivity type, one of the power terminals of the seventh transistor being connected to one of the power terminals of the third transistor and one of the power terminals of the eighth transistor being connected to one of the power terminals of the fourth transistor, and wherein the gate of the third transistor is connected to one of the power terminals of the second transistor, the gate of the fourth transistor being connected to one of the power terminals of the first transistor, the gate of the seventh transistor being connected to one of the power terminals of the fifth transistor via a first capacitor and the gate of the eighth transistor being connected to one of the power terminals of the sixth transistor via a second capacitor or wherein the gate of the third transistor is connected to one of the power terminals of the first transistor, the gate of the fourth transistor being connected to one of the power terminals of the second transistor, the gate of the seventh transistor being connected to one of the power terminals of the fifth transistor via a first capacitor, and the gate of the eighth transistor being connected to one of the power terminals of the sixth transistor via a second capacitor or wherein the gate of the third transistor is connected to one of the power terminals of the first transistor, the gate of the fourth transistor being connected to one of the power terminals of the second transistor, the gate of the seventh transistor being connected to one of the power terminals of the sixth transistor via a first capacitor and the gate of the eighth transistor being connected to one of the power terminals of the fifth transistor via a second capacitor.

5. The amplifier circuit of claim 4, wherein the gate of the seventh transistor is connected to a terminal of a current sources via a first resistor and the gate of the eighth transistor is connected to the terminal of the current source via a second resistor.

6. The amplifier circuit of claim 4, further comprising ninth and tenth MOS transistors of the first conductivity type, one of the power terminals of the ninth transistor being connected to one of the power terminals of the fifth transistor and one of the power terminals of the tenth transistor being connected to one of the power terminals of the sixth transistor A, the gate of the ninth transistor being connected to one of the power terminals of the sixth transistor via a third capacitor and the gate of the tenth transistor being connected to one of the power terminals of the fifth transistor via a fourth capacitor.

7. The amplifier circuit of claim 6, wherein the gate of the ninth transistor is connected to a terminal of a current source via a third resistor and the gate of the tenth transistor is connected to the terminal of the current source via a fourth resistors.

8. The amplifier circuit of claim 4, wherein the first amplification stage comprises eleventh and twelfth MOS transistors of the first conductivity type, one of the power terminals of the eleventh transistor being connected to one of the power terminals of the first transistor and one of the power terminals of the twelfth transistor being connected to one of the power terminals of the second transistor, the amplifier circuit comprising a circuit for biasing the gates of the eleventh and twelfth transistors.

9. The amplifier circuit of claim 8, wherein the bias circuit comprises thirteenth and fourteenth MOS transistors of the first conductivity type, diode-assembled, the gate of the thirteenth transistor being connected to the gate of the eleventh transistor and the gate of the fourteenth transistor being connected to the gate of the twelfth transistor, one of the power terminals of the thirteenth transistor being connected to one of the power terminals of the fifth transistor and one of the power terminals of the fourteenth transistor being connected to one of the power terminals of the sixth transistor, the power terminals of the thirteenth transistor being interconnected by a fifth capacitor and the power terminals of the fourteenth transistor being interconnected by a sixth capacitors.

10. The amplifier circuit of claim 4, comprising a fourth amplification stage between the first and the second amplification stages, wherein the fourth amplification stage comprises fifteenth and sixteenth MOS transistors of the second conductivity type, the gate of the fifteenth MOS transistor being connected to one of the power terminals of the first transistor and the gate of the sixteenth MOS transistor being connected to one of the power terminals of the second transistor, the gate of the third transistor being connected to one of the power terminals of the fifteenth transistor and the gate of the fourth transistor being connected to one of the power terminals of the sixteenth transistor.

11. A method for amplifying a first signal comprising:
  amplification of the first signal through a first amplification path in which the first signal is successively amplified several times, the amplification comprising at least a first amplification of the first signal, and directly feeding, without high-frequency filtering, the amplified first signal to a second subsequent amplification to provide a second signal; and
  amplification of the first signal through a second amplification path comprising the provision of a third signal corresponding to the low-impedance copying of the first signal, and the imposing, at frequencies greater than a given frequency, changes to the phase of the second signal relative to the third signal.

12. An amplifier, comprising:
  an amplifier input node;
  an amplifier output node;
  a gain circuit comprising a plurality of directly connected amplification stages coupled between the amplifier input and output nodes; and
  a first high-pass filter having a filter input node coupled to the amplifier input node, a filter output node coupled to the amplifier output node, a first amplification stage coupled to the filter input node, a second amplification stage coupled to the filter output node, and an impedance disposed between the first and second amplification stages and being variable with a frequency of a signal being passed between the filter input and output nodes, the filter input node having an input impedance, and the filter output node having an output impedance that is significantly lower than the input impedance.

13. An amplifier, comprising:
  an amplifier input node;
  an amplifier output node;
  a gain circuit coupled between the amplifier input and output nodes, the gain circuit having a unity-gain frequency; and
  a first high-pass filter having a filter input node coupled to the amplifier input node and having a filter output node coupled to the amplifier output node, the filter input node having an input impedance and the filter output node having an output impedance that is significantly lower than the input impedance, the high-pass filter having a zero at a frequency that is lower than the unity-gain frequency.

14. An amplifier, comprising:
  an amplifier input node;
  an amplifier output node;
  a gain circuit coupled between the amplifier input and output nodes, the gain circuit comprising a first gain stage having an input node coupled to the amplifier input node and having an output node, and a second gain stage having an input node coupled to the output node of the first stage and having an output node coupled to the amplifier output node; and
  a high-pass filter having a filter input node coupled to the amplifier input node and having a filter output node coupled to the amplifier output node, the filter input node having an input impedance and the filter output node having an output impedance that is significantly lower than the input impedance, the high-pass filter comprises unity-gain amplifier having an input node coupled to the amplifier input node and having an output node, a capacitor having a first node coupled to the output node of the unity-gain amplifier and having a second node, and a gain stage having an input node coupled to the second node of the capacitor and having an output node coupled to the amplifier output node.

15. The amplifier of claim 12, further comprising: wherein the gain circuit comprises first gain stage having an input node coupled to the amplifier input node and having an output node, a second gain stage having an input node coupled to the output node of the first stage and having an output node, and a third gain stage having an input node coupled to the output node of the second stage and having an output node coupled to the amplifier output node; wherein the first high-pass filter comprises unity-gain amplifier having an input node coupled to the amplifier input node and having an output node, a first capacitor having a first node coupled to the output node of the unity-gain amplifier and having a second node, and a fourth gain stage having an input node coupled to the second node of the capacitor and having an output node coupled to the amplifier output node; and a second high-pass filter, comprising second capacitor having a first node coupled to the output node of the unity-gain amplifier and having a second node, and a fifth gain stage having an input node coupled to the second node of the second capacitor and having an output node coupled to the output node of the second gain stage.

16. The amplifier of claim 12 wherein the high-pass filter comprises: a follower transistor having a control node coupled to the amplifier input node and having an output node; a capacitor having a first node coupled to the output node of the transistor and having a second node; and a gain stage having an input node coupled to the second node of the capacitor and having an output node coupled to the amplifier output node.

17. A method, comprising:
generating a first component signal by amplifying an input signal with a first gain that changes with frequency at a first rate below a first frequency, the first gain being substantially unity at the first frequency, the first rate having a first polarity;
generating a second component signal by amplifying the input signal with a second gain that changes with frequency at a second rate above a second frequency that is lower than the first frequency, the second rate having a second polarity that is opposite to the first polarity, the first gain being greater than unity at the second frequency; and
generating an output signal by combining the first and second component signals.

18. A method comprising:
generating a first component signal by amplifying an input signal with a first gain that changes with frequency at a first rate below a first frequency, the first rate having a first polarity, wherein generating the first component signal comprises introducing a first phase shift of a third polarity to the first component relative to a phase of the input signal;
generating a second component signal by amplifying the input signal with a second gain that changes with frequency at a second rate above a second frequency that is lower than the first frequency, the second rate having a second polarity that is opposite to the first polarity, wherein generating the second component signal comprises introducing a second phase shift of a fourth polarity to the second component relative to the phase of the input signal; and
generating an output signal by combining the first and second component signals.

19. The amplifier circuit of claim 1 wherein the component comprises a conductor.

* * * * *